(12) United States Patent
Serizawa

(10) Patent No.: US 12,429,794 B2
(45) Date of Patent: Sep. 30, 2025

(54) IMAGE FORMING APPARATUS

(71) Applicant: CANON KABUSHIKI KAISHA, Tokyo (JP)

(72) Inventor: Shinsuke Serizawa, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/773,334

(22) Filed: Jul. 15, 2024

(65) Prior Publication Data

US 2024/0369951 A1 Nov. 7, 2024

Related U.S. Application Data

(63) Continuation of application No. 18/057,156, filed on Nov. 18, 2022, now Pat. No. 12,085,868.

(30) Foreign Application Priority Data

Nov. 25, 2021 (JP) .................................. 2021-190757

(51) Int. Cl.
G03G 21/16 (2006.01)
G03G 15/00 (2006.01)
G03G 15/02 (2006.01)

(52) U.S. Cl.
CPC .......... *G03G 15/0266* (2013.01); *G03G 15/80* (2013.01); *G03G 21/1652* (2013.01);
(Continued)

(58) Field of Classification Search
CPC ........... G03G 15/0266; G03G 21/1642; G03G 21/1633; G03G 15/80; G03G 21/1652; G03G 2221/166; G03G 2215/00978; H05K 2201/09163; H05K 2201/09154; H05K 2201/10363; H05K 2201/0394; H05K 2201/10287

See application file for complete search history.

(56) References Cited

U.S. PATENT DOCUMENTS

| | | |
|---|---|---|
| 5,870,655 A | 2/1999 | Nishiuwatoko |
| 2003/0109153 A1 | 6/2003 | Tomimori |

(Continued)

FOREIGN PATENT DOCUMENTS

| | | |
|---|---|---|
| JP | 2011053410 A | 3/2011 |
| JP | 6104189 B2 | 3/2017 |

(Continued)

*Primary Examiner* — Stephanie E Bloss
*Assistant Examiner* — Laura Roth
(74) *Attorney, Agent, or Firm* — Canon U.S.A., Inc. IP Division

(57) ABSTRACT

An image forming apparatus includes an image forming unit configured to form an image on a recording material, a printed circuit board including a voltage generation unit mounted thereon and configured to generate a voltage to be applied to the image forming unit, a conductive member provided on the printed circuit board, to which the voltage generated by the voltage generation unit is applied, an elastic member including an arm portion configured to be biased toward the conductive member, and configured to connect the conductive member and the image forming unit, and a holding unit configured to hold the arm portion of the elastic member at a position where the arm portion is not in contact with the conductive member.

7 Claims, 20 Drawing Sheets

(52) U.S. Cl.
CPC .......... *G03G 2215/00978* (2013.01); *G03G 2221/166* (2013.01); *H05K 2201/0394* (2013.01); *H05K 2201/09154* (2013.01); *H05K 2201/10363* (2013.01)

(56) References Cited

U.S. PATENT DOCUMENTS

2015/0216036 A1    7/2015  Serizawa
2017/0308026 A1*  10/2017  Imaizumi ........... G03G 15/0233

FOREIGN PATENT DOCUMENTS

| | | |
|---|---|---|
| JP | 2018146915 A | 9/2018 |
| JP | 2019045812 A | 3/2019 |
| JP | 2020065020 A | 4/2020 |

* cited by examiner

IMAGE FORMING APPARATUS

CROSS-REFERENCE TO RELATED APPLICATIONS

The present application is a continuation of U.S. patent application Ser. No. 18/057,156, filed on Nov. 18, 2022, which claims priority from Japanese Patent Application No. 2021-190757, filed Nov. 25, 2021, which are hereby incorporated by reference herein in their entireties.

BACKGROUND

Field of the Disclosure

The present disclosure relates to an image forming apparatus including a circuit board.

Description of the Related Art

An electrophotographic image forming apparatus forms an electrostatic latent image on a photosensitive member charged by a charging unit, develops the electrostatic latent image into a toner image at a development unit, and transfers the developed toner image onto a recording material at a transfer unit, thereby forming an image. At this time, a high voltage of several hundred volts to several kilovolts is applied to the charging unit, the development unit, and the transfer unit. Therefore, the image forming apparatus includes a circuit board equipped with a high-voltage power supply circuit that generates the high voltage.

Japanese Patent No. 6104189 discusses a configuration in which an electric contact is formed by a jumper wire provided on a circuit board and a torsion coil spring provided on a main body side to supply a high voltage generated by a high-voltage power supply circuit to each process member.

The configuration discussed in Japanese Patent No. 6104189 may lead to limitations on the method for mounting the circuit board onto the image forming apparatus. More specifically, the circuit board in Japanese Patent No. 6104189 needs to be mounted onto the image forming apparatus while the jumper wire provided on the circuit board is pressed against an arm portion of the torsion coil spring that is biased in a predetermined direction. For example, the circuit board needs to be mounted onto the image forming apparatus in such a manner that the circuit board is inserted from the opposite side from the direction in which the arm portion of the torsion coil spring is biased. Due to the limitation on the mounting method, the configuration discussed in Japanese Patent No. 6104189 may be unusable depending on the configuration of the image forming apparatus or the circuit board.

SUMMARY

Aspects of the present disclosure provide for forming an electric contact using an elastic member such as a torsion coil spring regardless of a method of mounting a circuit board.

According to an aspect of the present disclosure, an image forming apparatus includes an image forming unit configured to form an image on a recording material, a printed circuit board including a voltage generation unit mounted thereon and configured to generate a voltage to be applied to the image forming unit, a conductive member provided on the printed circuit board, to which the voltage generated by the voltage generation unit is applied, an elastic member including an arm portion configured to be biased toward the conductive member, and configured to connect the conductive member and the image forming unit, and a holding unit configured to hold the arm portion of the elastic member at a position where the arm portion is not in contact with the conductive member.

Further features of the present disclosure will become apparent from the following description of embodiments with reference to the attached drawings.

DESCRIPTION OF THE EMBODIMENTS

In the following description, configurations for implementing the present disclosure will be described in detail based on embodiments thereof with reference to the drawings. Dimensions, materials, shapes, a relative layout, and the like of components that will be described in these embodiments may be changed as appropriate in accordance with the configuration of an apparatus to which the present disclosure is applied and various kinds of conditions. They are not intended to limit the scope of the present disclosure to the embodiments that will be described below.

Overall Configuration of Image Forming Apparatus

The overall configuration of an image forming apparatus 1 according to a first embodiment will be described. The image forming apparatus 1 according to the present embodiment is a monochrome laser beam printer using the electrophotographic process, and is configured to form an image on a recording material P with toner (a developer) in accordance with image information transmitted from an external apparatus such as a personal computer. Examples of the recording material P include recording paper, label paper, an overhead projector (OHP) sheet, and a cloth.

Further, in the following description, a Z direction will be defined as the height direction of the image forming apparatus 1 when the image forming apparatus 1 is set up on a horizontal surface (a direction opposite from the direction of gravitational force). An X direction will be defined as a direction intersecting with the Z direction and extending in parallel with an axial direction (a main scanning direction) of a photosensitive drum 11, which will be described below. A Y direction will be defined as a direction intersecting with the X direction and the Z direction. Desirably, the X direction, the Y direction, and the Z direction perpendicularly intersect with one another. Further, for the sake of convenience, a positive side and a negative side in the X direction will be referred to as a right side and a left side, respectively. A positive side and a negative side in the Y direction will be referred to as a front side or a front surface side and a back side or a back surface side, respectively. A positive side and a negative side in the Z direction will be referred to as an upper side and a lower side, respectively.

Figure 1:
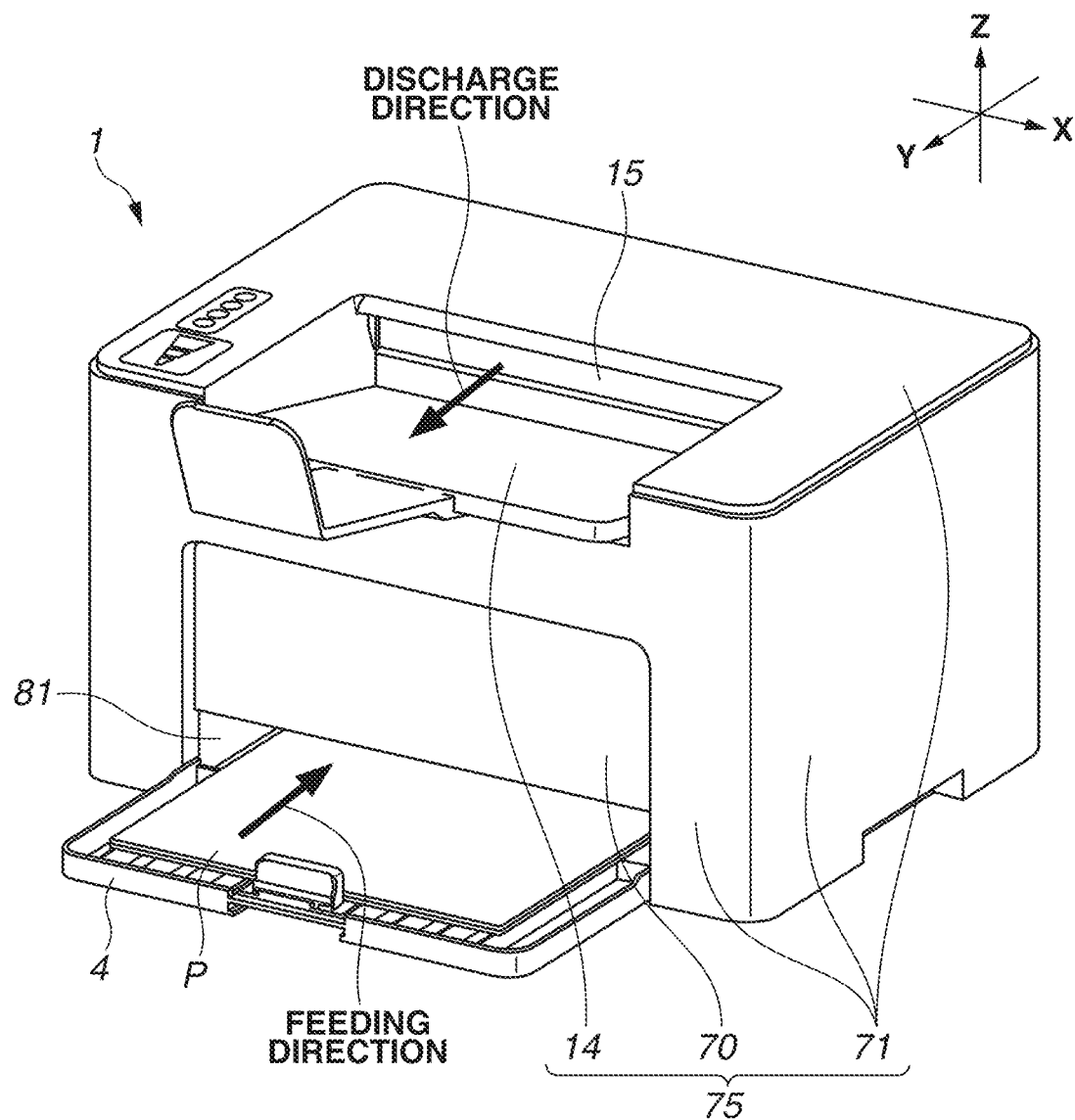
FIG. 1 is a perspective view of an image forming apparatus.
Figure 2:
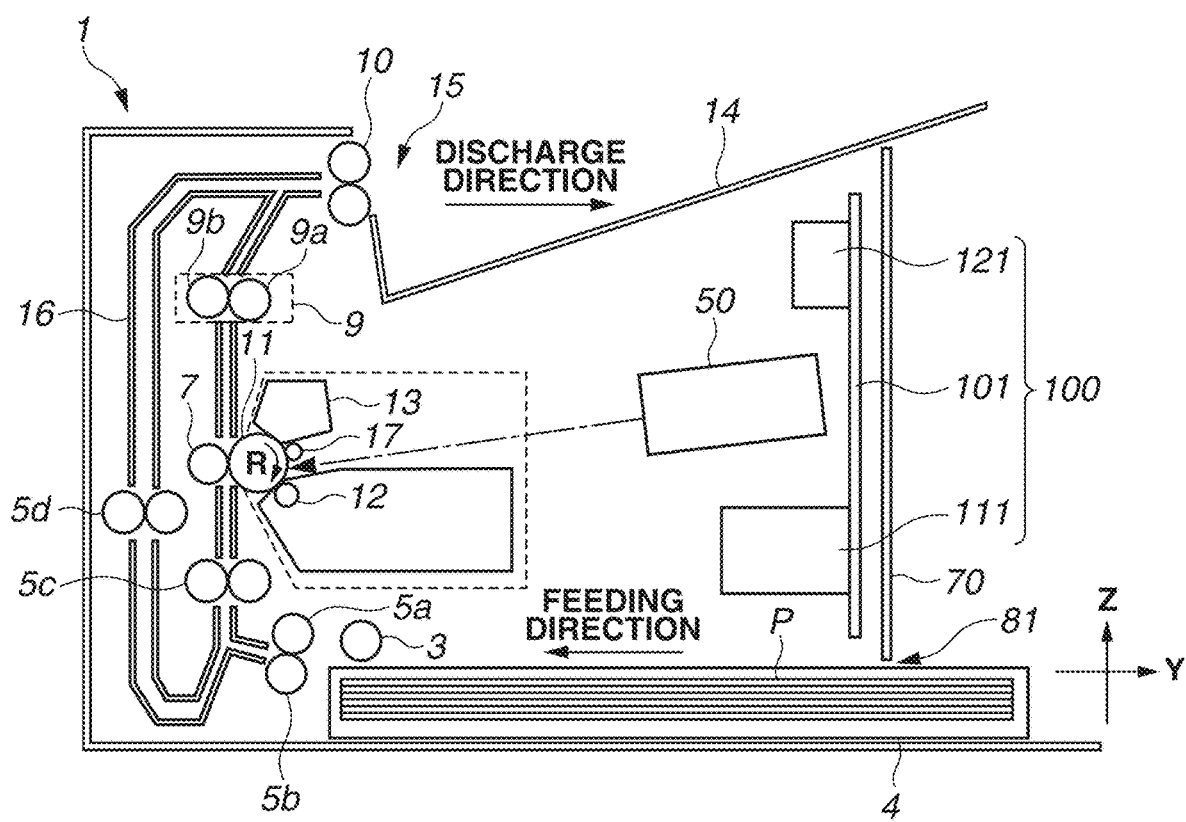
FIG. 2 is a cross-sectional view of the image forming apparatus.

FIG. 1 illustrates a perspective view of the image forming apparatus 1, and FIG. 2 illustrates a cross-sectional view taken along a plane perpendicular to the X direction of the image forming apparatus 1 (the direction of the rotational axis of the photosensitive drum 11). In FIG. 1, the image forming apparatus 1 includes a feeding cassette 4, in which the recording material P is contained, and a discharge tray 14, on which the discharged recording medium P is stacked. Insertion of the feeding cassette 4 in a feeding port 81 brings the image forming apparatus 1 into a state that the recording material P contained in the feeding cassette 4 can be fed into the image forming apparatus 1.

Further, the feeding cassette 4 is configured to be pulled out from the feeding port 81 in the Y direction, and a user can replenish the recording material P thereto. The recording material P fed from the feeding cassette 4 and subjected to image formation thereon is discharged from a discharge port 15 toward a discharge direction illustrated in FIG. 1 (a direction toward the positive side of the Y axis), and is stacked onto the discharge tray 14.

A front cover 70 is provided at a part of the end surface (a part of the front surface) of the image forming apparatus 1 on the downstream side in the discharge direction, and covers a circuit board 100, which will be described below. An exterior cover 71 is provided on a part of the front surface, the side surfaces and the top surface of the image forming apparatus 1. The front cover 70, the exterior cover 71, and the foregoing discharge tray 14 form a housing 75 of the image forming apparatus 1 together. The housing 75 is a member covering the image forming apparatus 1, and includes therein process members such as an optical box 50, which will be described below. The foregoing feeding port 81 and discharge port 15 are openings formed on a part of the housing 75, and the recording material P is inserted into the image forming apparatus 1 through the feeding port 81 and is discharged out of the image forming apparatus 1 through the discharge port 15.

A flow of an image forming operation on the recording material P will be described with reference to the cross-sectional view of FIG. 2. When the image information is transmitted to the image forming apparatus 1, the photosensitive drum 11 (an image bearing member), which is a rotational member, is rotationally driven at a predetermined circumferential speed (a process speed) in a direction indicated by an arrow R based on a print start signal. The optical box 50 irradiates the photosensitive drum 11 with laser light based on the input image information. The optical box 50 is a box-like unit including therein members such as a laser oscillator that outputs the laser light, a polygon mirror and a lens for irradiating the photosensitive drum 11 with the laser light, and a scanner motor for rotating the polygon mirror. The photosensitive drum 11 is charged by a charging roller 17 in advance, and an electrostatic latent image is formed on the photosensitive drum 11 with the laser light irradiated on the photosensitive drum 11. After that, the electrostatic latent image is developed with toner by a development roller 12, and then a toner image is formed on the photosensitive drum 11.

The recording material P is fed from the feeding cassette 4 in parallel with the above-described image forming process. A pickup roller 3, a feeding roller 5a, and a conveyance roller pair 5c are provided on a conveyance path in the image forming apparatus 1. The pickup roller 3 (a feeding member) comes into contact with a recording material P located at the uppermost position among the recording materials P contained in the feeding cassette 4, and feeds the recording material P in a feeding direction (a direction toward the negative side of the Y axis) with the rotation of the roller itself. The feeding roller 5a and a separation pad 5b that is in pressure contact with the feeding roller 5a form a separation nip. If a plurality of recording materials P is undesirably fed to the separation nip due to the influence of a frictional force between the recording materials P, the feeding roller 5a and the separation pad 5b separate the plurality of recording materials P one by one, and feed only the recording material P located at the uppermost position to the downstream side.

The recording material P fed from the feeding cassette 4 is conveyed toward a transfer roller 7 by the conveyance roller pair 5c. The toner image formed on the photosensitive drum 11 is transferred onto the recording material P due to application of a transfer bias to the transfer roller 7. The recording material P with the toner image transferred thereon by the transfer roller 7 is subjected to heating and pressing processing by a fixing device 9, and then the toner image is fixed onto the recording material P. The fixing device 9 includes a heating roller 9a, which includes a not-illustrated heater built therein, and a pressing roller 9b, which is biased toward the heating roller 9a. Then, the recording material P with the toner image fixed thereon is discharged onto the discharge tray 14 by a discharge roller pair 10.

When images are formed on the both surfaces of the recording material P, the discharge roller pair 10 guides the recording material P to a two-sided conveyance path 16 by causing the recording material P with the image formed on a first surface thereof to be switched back.

The recording material P guided to the two-sided conveyance path 16 is conveyed toward the transfer roller 7 again by a two-sided conveyance roller pair 5d. The recording material P is discharged out of the apparatus by the discharge roller pair 10 after an image is formed on a second surface of the recording material P by the transfer roller 7. Further, after the toner image is transferred on the recording material P, the toner remaining on the photosensitive drum 11 is removed by a cleaning unit 13.

As illustrated in FIG. 2, the image forming apparatus 1 includes the circuit board 100. The circuit board 100 includes a printed circuit board 101 made of an insulating material, and electronic component groups 111 and 121 soldered on the printed circuit board 101. Conductor wiring is laid on the printed circuit board 101, and thus the electronic component groups 111 and 121 are electrically connected to each other. The circuit board 100 is equipped with a not-illustrated converter circuit that rectifies a voltage supplied from the outside of the image forming apparatus 1 and converts the voltage to acquire a predetermined voltage value necessary for the image forming process.

As illustrated in FIG. 2, the circuit board 100 is disposed in such an orientation that the surface of the printed circuit board 101 with the electronic component groups 111 and 121 mounted thereon intersects with the discharge direction. Further, the printed circuit board 101 is provided between the front cover 70 and the optical box 50 in the discharge direction. The electronic component groups 111 and 121 are disposed on the surface of the printed circuit board 101 which faces the optical box 50.

Layout of Circuit Board

Figure 3:
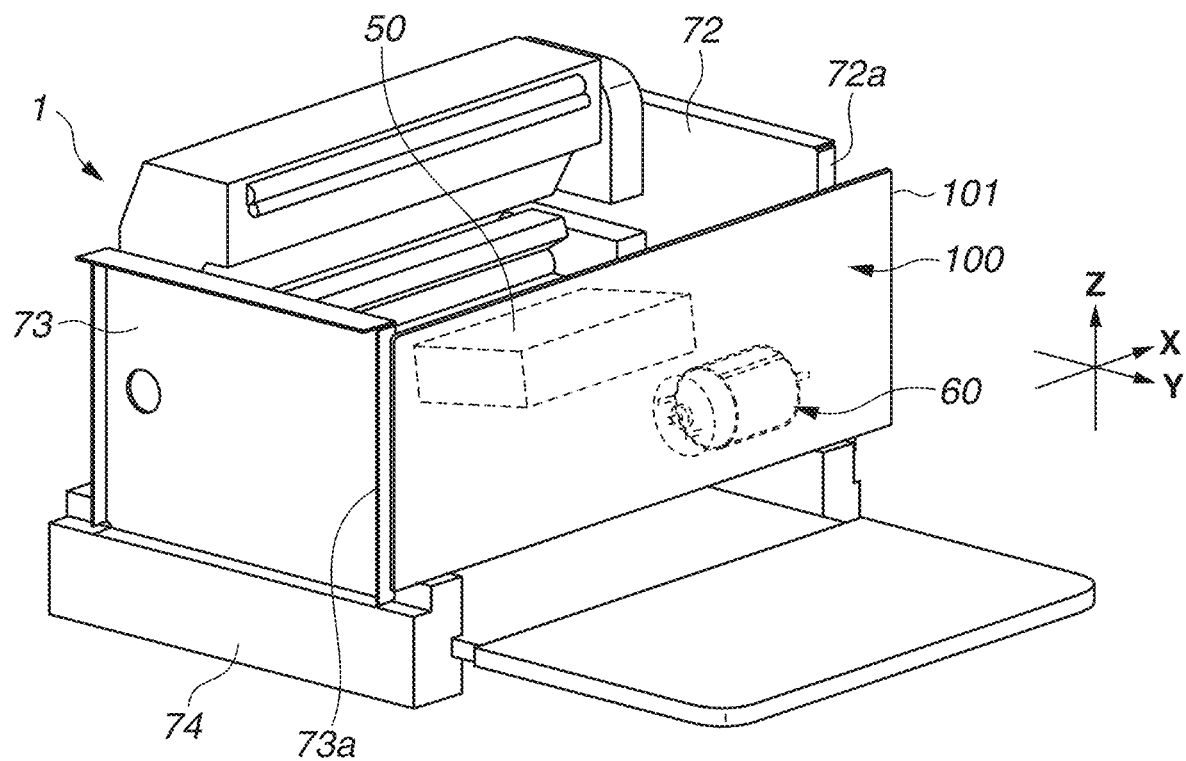
FIG. 3 is a perspective view illustrating the position of a circuit board.

The layout of the circuit board 100 according to the present embodiment will be described in detail with reference to FIGS. 3 to 8. FIG. 3 is a perspective view of the image forming apparatus 1 illustrating the layout of the circuit board 100, and the front cover 70 and the exterior cover 71 are omitted in the FIG. 3 unlike FIG. 1. As illustrated in FIG. 3, the circuit board 100 is set up on the front surface side, and the optical box 50 and a driving motor 60 are disposed on the inner side behind the circuit board 100 (the negative side in the Y direction). In FIG. 3, the optical box 50 and the driving motor 60 are illustrated with dotted lines because they are located at positions that cannot be seen actually.

As illustrated in FIG. 3, the image forming apparatus 1 includes a right-side plate frame 72 (a first-side plate frame), a left-side plate frame 73 (a second-side plate frame), and a base frame 74. The right-side plate frame 72 supports the right-side end portion (a first end portion) of the photosensitive drum 11 in the X direction, and the left-side plate frame 73 supports the left-side end portion (a second end portion) of the photosensitive drum 11 in the X direction. The base frame 74 is provided on the bottom surface, and supports the right-side plate frame 72 and the left-side plate frame 73 from below.

The circuit board 100 is supported by these frame members, and is mounted on the image forming apparatus 1 in such a manner that the circuit board 100 extends substantially in parallel with the XZ plane. Bent portions 72a and 73a are provided for reinforcement at the respective end portions of the right-side plate frame 72 and the left-side plate frame 73 in the Y direction. The bent portion 72a is bent toward the positive side in the X direction so as to extend substantially in parallel with the XZ plane, and the bent portion 73a is bent toward the negative side in the X direction so as to extend substantially in parallel with the XZ plane. In other words, the bent portions 72a and 73a are bent so as to extend along the surface of the printed circuit board 101. The plate frames on the both sides are bent toward outside the image forming apparatus 1 (in directions away from the photosensitive drum 11 in the X direction) in this manner, and thus the present configuration allows electronic components to be mounted on a further large region of the printed circuit board 101.

Figure 4:
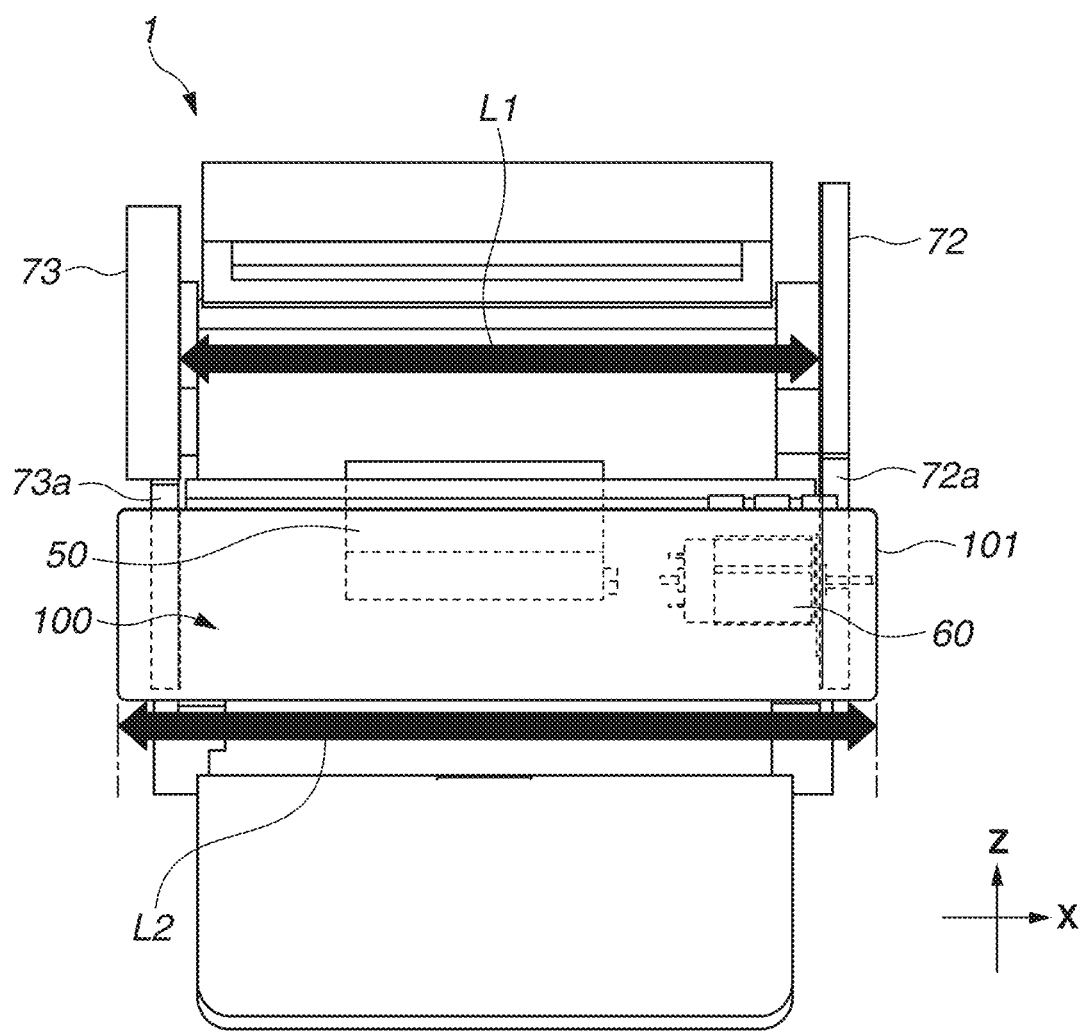
FIG. 4 is a front perspective view illustrating the position of the circuit board.

FIG. 4 is a front perspective view of the image forming apparatus 1 illustrating the layout of the circuit board 100. As illustrated in FIG. 4, a distance L1 between the inner surfaces of the right-side plate frame 72 and the left-side plate frame 73 in the X direction is shorter than a length L2 of the circuit board 100 in the X direction. The printed circuit board 101 is arranged on the positive side (the front surface side) in the Y direction relative to the bent portions 72a and 73a, and the printed circuit board 101 is in contact with each of the bent portions 72a and 73a. The circuit board 100 overlaps the bent portions 72a and 73a when viewed from the front surface side. In FIG. 4, parts of the bent portions 72a and 73a, the optical box 50, and the driving motor 60 are illustrated with dotted lines to illustrate they are located at positions that are normally covered.

Positional Relationship Between Electronic Members and Optical Box

Next, the positional relationship between the electronic component group 111 and the optical box 50 will be described in detail with reference to FIGS. 5 to 7.

Figure 5:
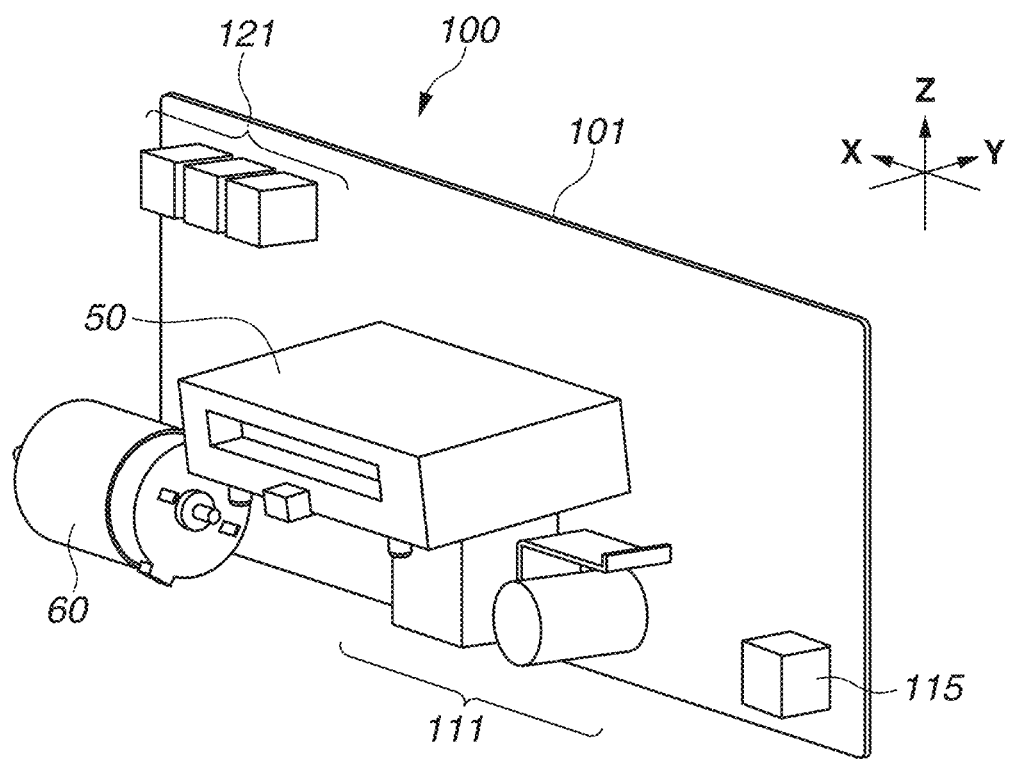
FIG. 5 is a perspective view of the circuit board and members disposed near the circuit board.

FIG. 5 is a perspective view illustrating the circuit board 100 when viewed from behind the main body. The electronic component group 111 having a larger size in the Y direction than other members is collectively placed together on the lower side of the printed circuit board 101 and is mounted so as to be contained below the optical box 50 for the purpose of effectively utilizing the space. More specifically, the electronic component group 111 is provided on the lower side with respect to the center of the printed circuit board 101 in the vertical direction. A power supply input unit 115 is provided at the end portion of the printed circuit board 101. The power supply input unit 115 is connected to a not-illustrated inlet, and receives power supply from a commercial power source.

Figure 6:
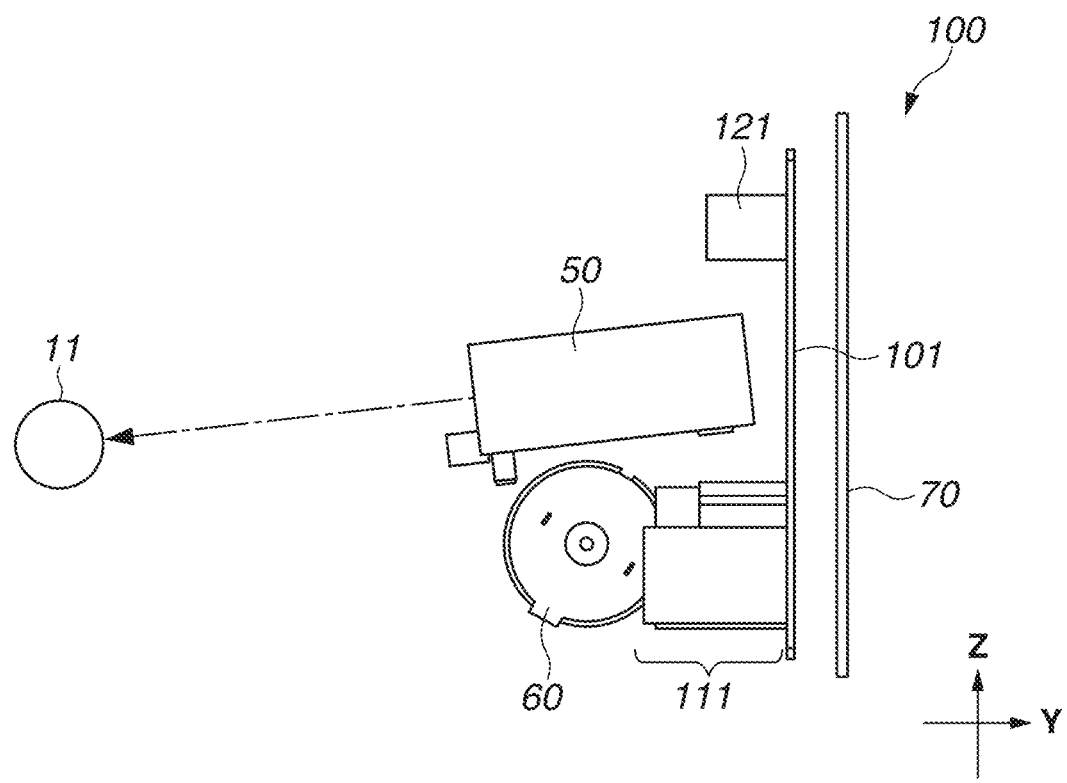
FIG. 6 is a side view of the circuit board and the members disposed near the circuit board.

FIG. 6 is an enlarged side view illustrating the circuit board 100 when viewed from the left side surface of the main body. The optical box 50 is disposed at an optimum position for irradiating the photosensitive drum 11 with the laser light indicated with a chain line. Further, a member such as the electronic component group 111 that significantly protrudes from the plate surface is not disposed at a portion where the optical box 50 and the printed circuit board 101 are located closest to each other in the Y direction. In other words, the optical box 50 and the electronic component group 111 are disposed at respective positions that are different from each other in the Z direction so as not to interfere with each other.

Figure 7:
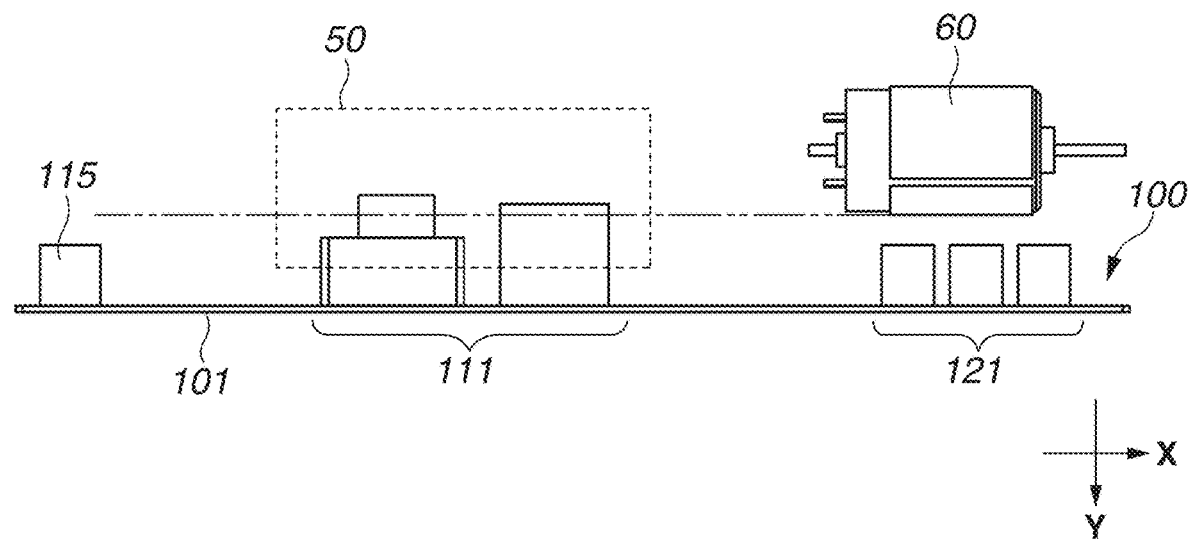
FIG. 7 is a top view of the circuit board and the members disposed near the circuit board.

FIG. 7 is an enlarged top view illustrating the circuit board 100 when viewed from the upper surface of the main body. Referring to this drawing, the optical box 50 and the electronic component group 111 are disposed at positions where they partially overlap each other. The optical box 50 is located above the electronic component group 111 as described above, and thus the electronic component group 111 cannot be visually confirmed from this direction actually. FIG. 7 illustrates the electronic component group 111 in a see-through manner with the optical box 50 indicated with a dotted line so as to indicate the positional relationship between the two members in an easily understandable way.

The electronic component group 111 is disposed at the above-described position in this manner, and thus the present configuration can reduce the distance between the circuit board 100 and the optical box 50 in the Y direction (the front-back direction), thereby reducing the size of the image forming apparatus 1.

Positional Relationship Between Electronic Components and Driving Motor

Next, the positional relationship between the electronic component group 111 and the driving motor 60 will be described in detail with reference to FIGS. 5 to 7. The driving motor 60 assumes the role of rotating members for feeding and conveying the recording material P (the pickup roller 3, the feeding roller 5a, the conveyance roller pair 5c, and the like) and the photosensitive drum 11.

As illustrated in FIG. 5, the driving motor 60 protrudes toward the negative side in the X direction, and the printed circuit board 101 is disposed on the front side of the main body relative to the driving motor 60. It can be understood that the electronic component group 111 is mounted to avoid the driving motor 60 so as not to interfere with the driving motor 60. As illustrated in FIG. 6, the driving motor 60 and the electronic component group 111 are disposed at positions where they partially overlap each other when viewed from the left side surface of the main body. Then, as illustrated in FIG. 7, the driving motor 60 and the electronic component group 111 are disposed at respective positions that are different from each other in the X direction so as not to interfere with each other when viewed from the upper surface of the main body.

The electronic component group 111 is disposed at the above-described position in this manner, and thus the present configuration can reduce the distance between the circuit board 100 and the driving motor 60 in the Y direction (the front-back direction), thereby reducing the size of the image forming apparatus 1.

Mounting of Optical Box and Driving Motor on Main Body

Figure 8:
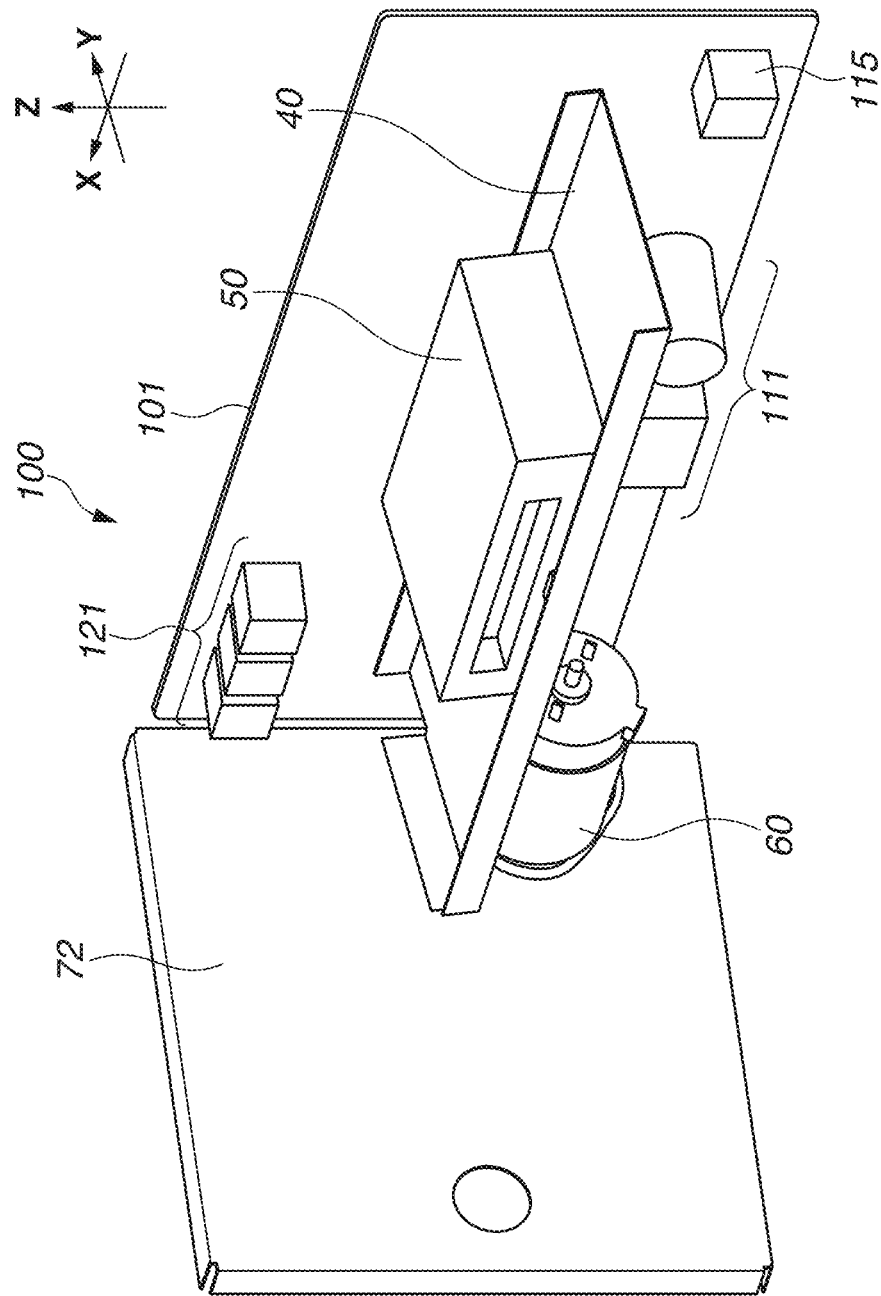
FIG. 8 is a perspective view illustrating configurations that hold an optical box and a driving motor.

Next, configurations for mounting the optical box 50 and the driving motor 60 on the main body will be described in detail with reference to FIG. 8. FIG. 8 corresponds to the perspective view illustrated in FIG. 5 with the right-side plate frame 72 and a scanner holding member 40 added thereto. The left-side plate frame 73 and the base frame 74 are omitted in FIG. 8.

The optical box 50 is held by the scanner holding member 40. The scanner holding member 40 is fixed to the right-side plate frame 72 and the left-side plate frame 73 (not illustrated in FIG. 8), and is configured to bridge the space between the two frame walls. The driving motor 60 is attached to the right-side plate frame 72, and a gear coupled with the driving motor 60 is provided on the positive side of the right-side plate frame 72 in the X direction. The driving force of the driving motor 60 is transmitted to the feeding roller 5a and the photosensitive drum 11 via this gear.

Configuration of Circuit Board

Figure 9:
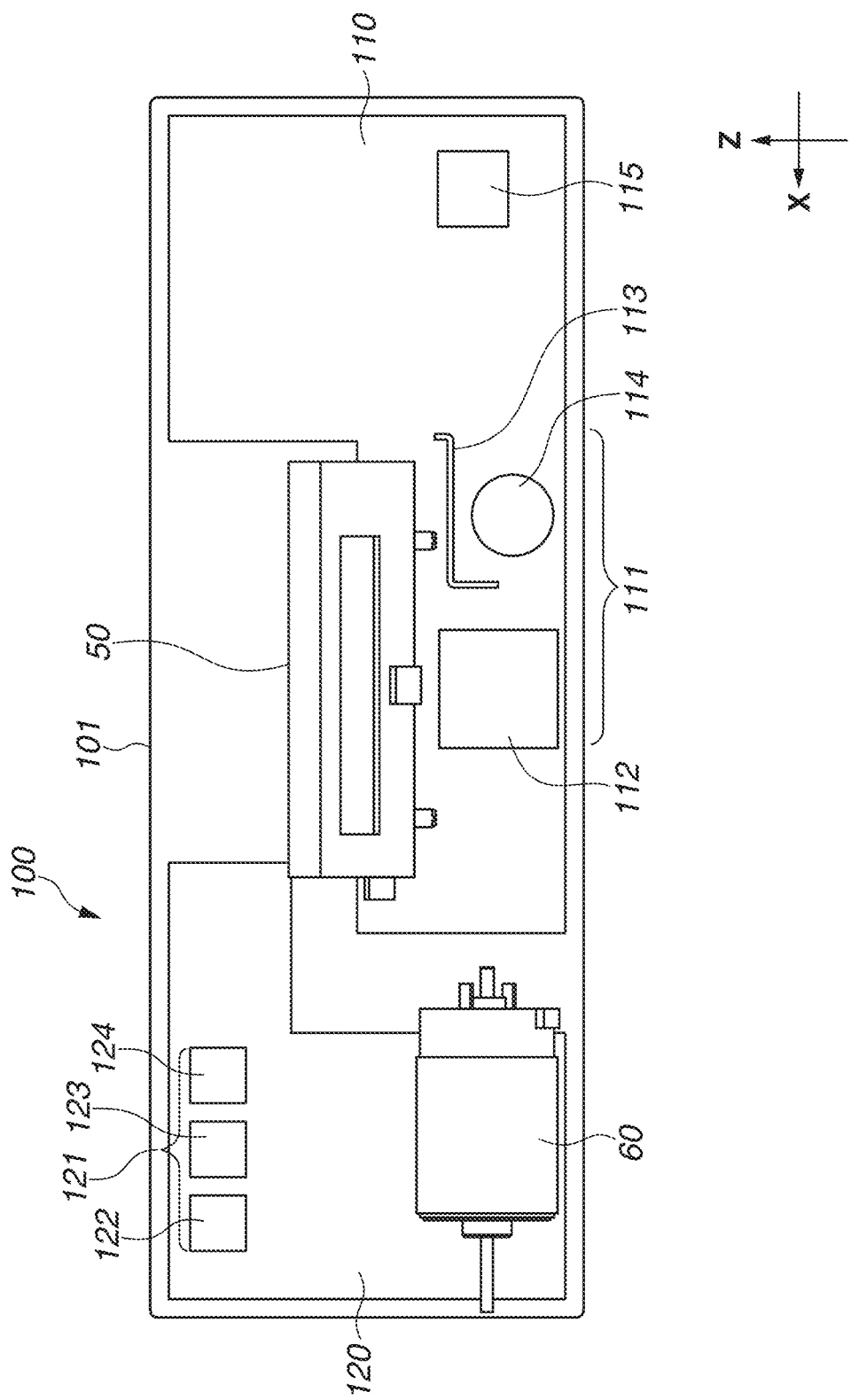
FIG. 9 illustrates electronic components on the circuit board.

Next, the configuration of the circuit board 100 will be described with reference to FIG. 9. FIG. 9 is a back view of the circuit board 100 when viewed from the back side of the main body. FIG. 9 illustrates not only the circuit board 100 but also the optical box 50 and the driving motor 60 in addition thereto.

The circuit board 100 includes the power supply input unit 115, which receives an alternating-current voltage from the commercial power source serving as an external power source, a low-voltage power supply unit 110, which converts the alternating-current voltage into a direct-current voltage, and a high-voltage power supply unit 120 for supplying a high voltage necessary for the image formation to each process member. In the case of the circuit board 100 according to the present embodiment, the low-voltage power supply unit 110 and the high-voltage power supply unit 120 are mounted on the same board.

The low-voltage power supply unit 110 includes a low-voltage power supply transformer 112, a heat sink 113, and an electrolytic capacitor 114 as the electronic component group 111 having a large size in the Y direction. The high-voltage power supply unit 120 includes a charging transformer 122, a development transformer 123, and a transfer transformer 124 as the electronic component group 121 having a large size in Y direction. As described above, both the electronic component groups 111 and 121 large-sized in the Y direction are mounted on the surface of the image forming apparatus 1 on the inner side (the negative side in the Y direction) while being arranged so as to avoid the positions of the optical box 50 and the driving motor 60 for the purpose of making good use of the space inside the image forming apparatus 1.

Function of Circuit Board

Figure 10:
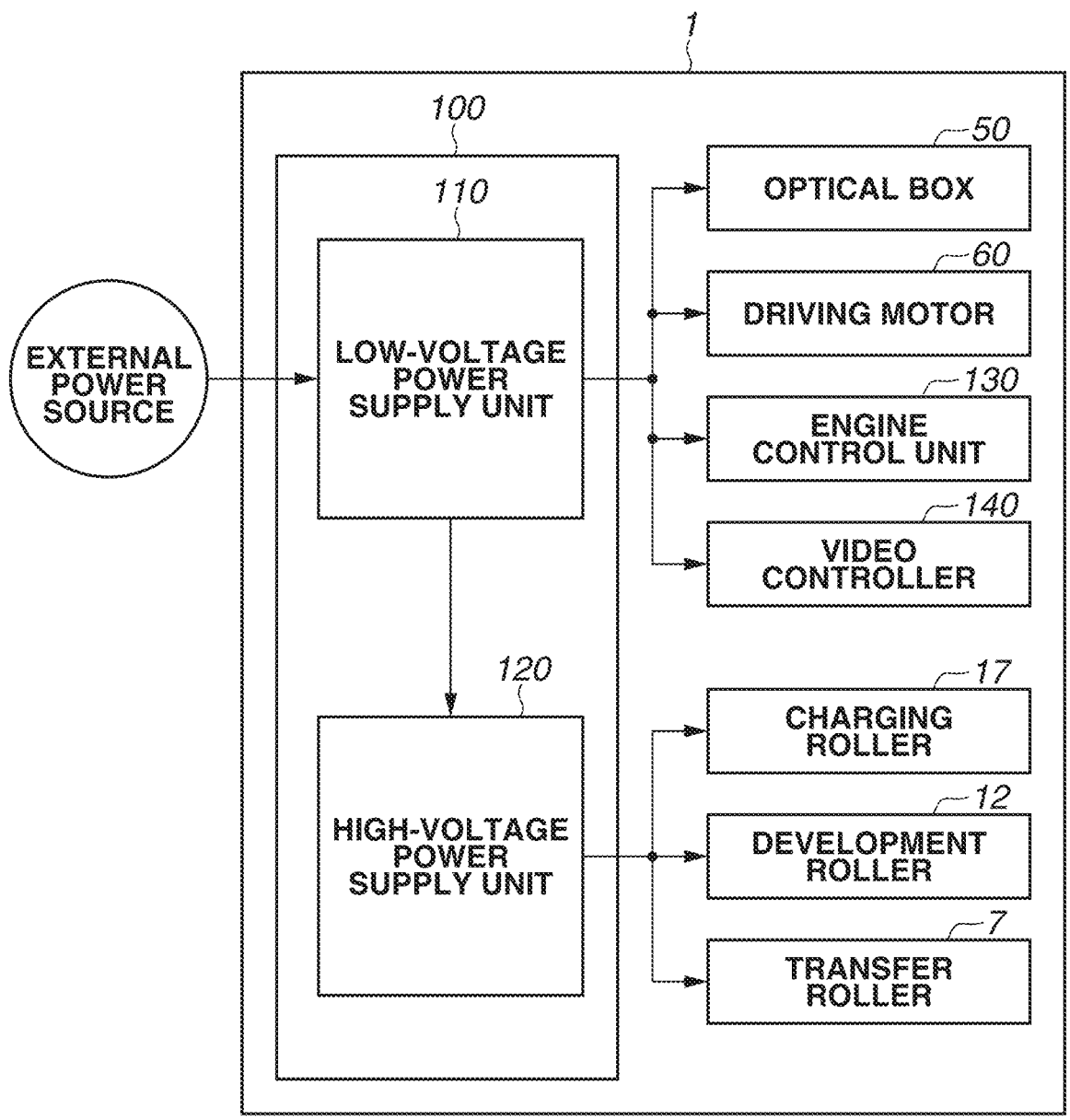
FIG. 10 is a block diagram illustrating functions of the circuit board.

Next, the functions of the low-voltage power supply unit 110 and the high-voltage power supply unit 120 will be described with reference to FIGS. 9 and 10. FIG. 10 is a block diagram illustrating the functions of the circuit board 100.

First, the low-voltage power supply unit 110 receives power from the commercial power source via the power supply input unit 115 mounted at the end portion of the circuit board 100, and converts an alternating-current voltage into a stable direct-current voltage by using a rectification and smoothing circuit including the electrolytic capacitor 114. After that, the low-voltage power supply unit 110 converts the direct-current voltage into a high-frequency alternating-current voltage by using a switching element such as a transistor, and then inputs the high-frequency alternating-current voltage into the low-voltage power supply transformer 112 after that. The low-voltage power supply transformer 112 converts the high-frequency alternating-current voltage, which is input from the low-voltage power supply unit 110, into an alternating-current voltage having a desired voltage value. The low-voltage power supply unit 110 converts the alternating-current voltage into the direct-current voltage again and outputs the acquired direct-current voltage to the high-voltage power supply unit 120 and the optical box 50. Further, the low-voltage power supply unit 110 is equipped with the heat sink 113 manufactured using aluminum or iron for heat dissipation because a power loss at the individual circuit components emerges as heat.

Direct-current voltages of 24 V, 3.3 V, and 5 V are output from the converter circuit of the above-described low-voltage power supply unit 110. The direct-current voltage of 24 V is supplied to the high-voltage power supply unit 120, and the direct-current voltages of 3.3 V and 5V are supplied to the optical box 50, the driving motor 60, an engine control unit 130, and a video controller 140. The direct-current voltages output from the low-voltage power supply unit 110 are supplied to the high-voltage power supply unit 120, the optical box 50, the driving motor 60, the engine control unit 130, and the video controller 140 via a wiring component such as a pattern on the printed circuit board 101, a harness, and the like.

The high-voltage power supply unit 120 converts the voltage supplied from the low-voltage power supply unit 110 (for example, 24 V) into a high voltage necessary for the image forming process such as the charging, the development, and the transfer. The charging transformer 122 converts the voltage supplied from the low-voltage power supply unit 110 into a voltage for the charging, and the converted voltage is then supplied to the charging roller 17.

The development transformer 123 converts the voltage supplied from the low-voltage power supply unit 110 into a voltage for the development, and the converted voltage is then supplied to the development roller 12. The transfer transformer 124 converts the voltage supplied from the low-voltage power supply unit 110 into a voltage for the transfer, and the converted voltage is then supplied to the transfer roller 7.

The optical box 50, the driving motor 60, the engine control unit 130, and the video controller 140 operate using the voltage (for example, 3.3 V or 5 V) supplied from the low-voltage power supply unit 110. Now, the engine control unit 130 assumes the role of comprehensively controlling various kinds of process members. The engine control unit 130 includes, for example, a central processing unit (CPU) (not illustrated), a random access memory (RAM) (not illustrated) used to, for example, calculate and temporarily store data necessary to control the image forming apparatus 1, and a read only memory (ROM) (not illustrated) storing therein a program for controlling the image forming apparatus 1 and various kinds of data. The engine control unit 130 may be provided on another board different from the circuit board 100 or may be provided on the same board as the circuit board 100. The video controller 140 assumes the role of communicating with the external apparatus such as the personal computer to receive print data, and notifying the engine control unit 130 of a result of analyzing the print data.

Configuration of Electric Contact

Figure 11:
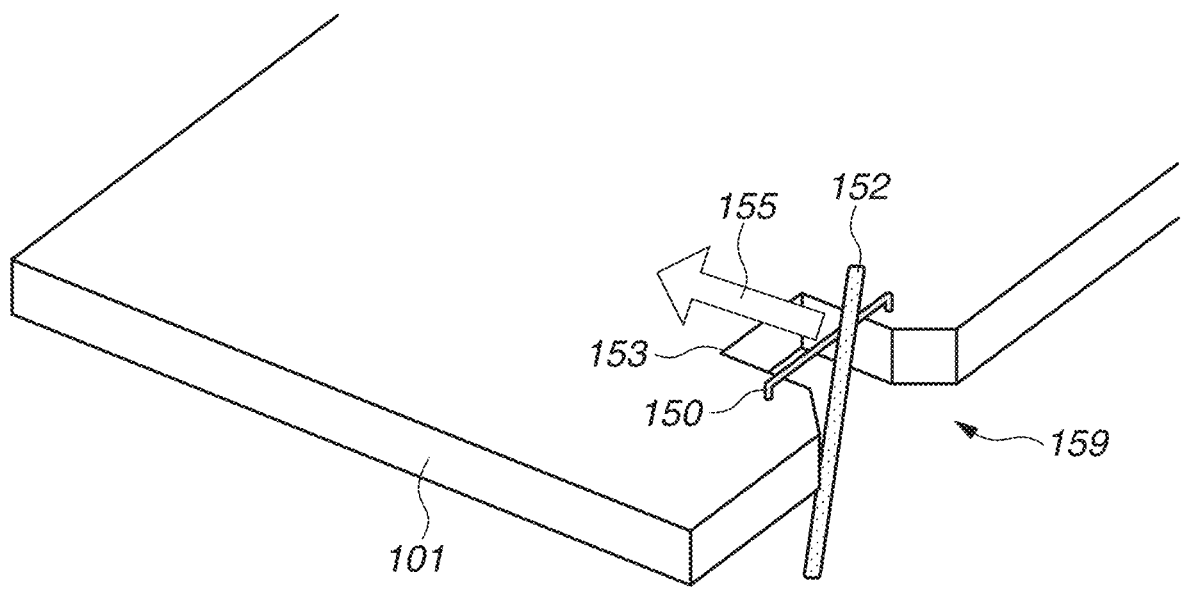
FIG. 11 is a perspective view illustrating the configuration of an electric contact.
Figure 12:
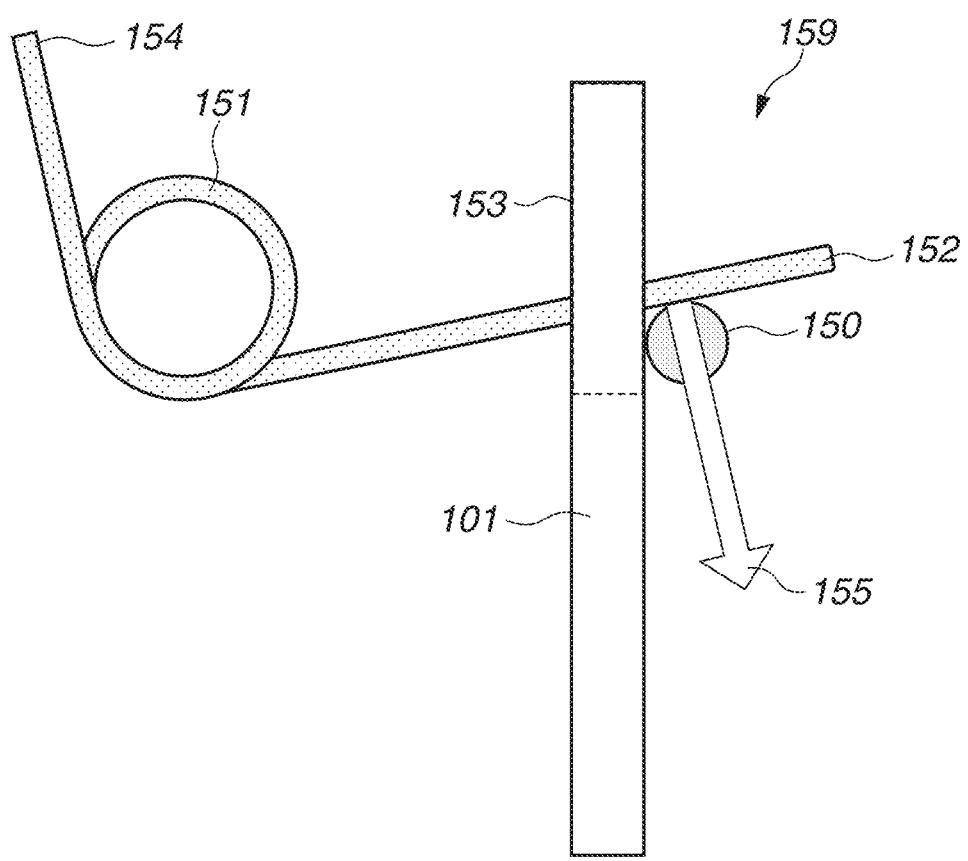
FIG. 12 is a cross-sectional view illustrating the configuration of the electric contact.

Next, the configuration of an electric contact for supplying the voltage output from the high-voltage power supply unit 120 to each process member will be described with reference to FIGS. 11 and 12. FIG. 11 illustrates a perspective view of a charging contact portion 159 provided at the edge of the printed circuit board 101, and FIG. 12 illustrates a cross-sectional view of the charging contact portion 159 provided at the edge of the printed circuit board 101. The configuration of an electric contact for the charging will be described here, although electric contacts for the development and the transfer are also configured similarly thereto.

As described above, the high-voltage power supply unit 120 converts the voltage supplied from the low-voltage power supply unit 110 into the high voltage for the charging by using a converter circuit for the charging (not illustrated) including the charging transformer 122.

In other words, the high-voltage power supply unit 120 functions as a voltage generation unit that generates the high voltage for the charging. Then, the high voltage is supplied to a jumper wire 150 illustrated in FIG. 11. The jumper wire 150 (a conductive member) is disposed so as to extend across a cutout portion 153 formed through the component surface and the soldered surface of the printed circuit board 101. This cutout portion 153 is structured to allow an arm portion 152 of a charging contact spring 151 (an elastic member) to enter it, and the jumper wire 150 and the arm portion 152 are brought into contact with each other when the arm portion 152 enters the cutout portion 153.

As illustrated in FIG. 12, the charging contact spring 151 is shaped as a torsion coil spring, and is configured such that a force acts on the arm portion 152 in a direction toward the jumper wire 150. As a result, the arm portion 152 is configured to press the jumper wire 150 in a direction indicated by an arrow 155 illustrated in FIGS. 11 and 12, thereby being designed to be stabilized as an electric contact.

Further, as illustrated in FIG. 12, the charging contact spring 151 includes two arm portions 152 and 154. The arm portion 152 is structured to come into contact with the jumper wire 150 as described above, and an arm portion 154 is connected to the charging roller 17 (not illustrated in FIG. 12). Therefore, when the arm portion 152 functions as the electric contact in contact with the jumper wire 150, this allows the high voltage generated by the converter circuit for the charging to be supplied to the charging roller 17 via the jumper wire 150 and the charging contact spring 151.

Mounting of Circuit Board

Figure 13:
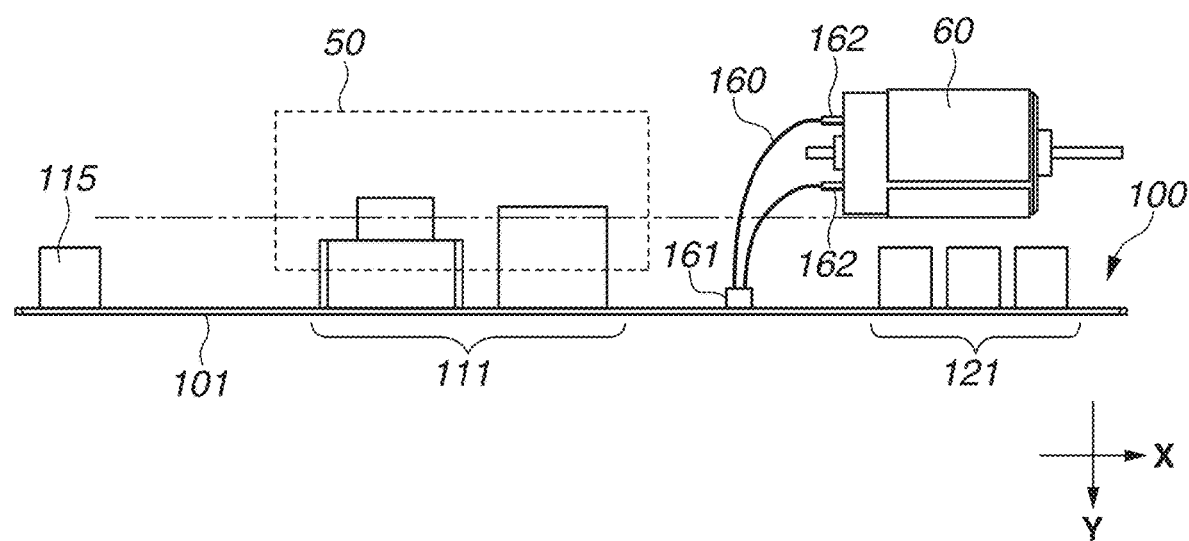
FIG. 13 is a top view illustrating a wiring route of a harness.

Next, a method for mounting the circuit board 100 onto the image forming apparatus 1 will be described with reference to FIG. 13. FIG. 13 is a top view of the circuit board 100 when viewed from above the image forming apparatus 1.

FIG. 13 illustrates a board-side connector 161 mounted on the printed circuit board 101, motor-side connectors 162 of the driving motor 60, and a harness 160 connecting the board-side connector 161 and the motor-side connectors 162. The space inside the housing 75 can be effectively utilized by disposing the board-side connector 161 to which the harness 160 is connected on the same surface as the electronic component groups 111 and 121 and arranging the wiring route of the harness 160 so as to avoid the positions of the process members, such as the optical box 50. Further, a reduction in the distance between the board-side connector 161 and the motor-side connectors 162 leads to a reduction in the length of the harness 160, thereby contributing to a reduction in the space for the wiring. Therefore, it is desirable that the board-side connector 161 is located near the motor-side connectors 162 in terms of the reduction in the size of the image forming apparatus 1.

In the case where the board-side connector 161 is disposed at a position near the motor-side connectors 162, it may be difficult for a worker to perform the operation to connect the board-side connector 161 and the motor-side connectors 162 in the state that the circuit board 100 is mounted on the image forming apparatus 1 as described with reference to FIGS. 3 to 6. The board-side connector 161 is hidden behind the printed circuit board 101 when viewed from the front surface side, and is also hidden behind the driving motor 60 when viewed from the right side. Further, the optical box 50 and the tall electronic component group 121 are disposed above the driving motor 60, and this also undesirably limits the space through which the worker can access the board-side connector 161 from above.

In this manner, in the case in which the wiring route of the harness 160 is designed in such a manner that the space in the housing 75 is effectively utilized to reduce the size of the image forming apparatus 1, it is difficult to perform the wiring work of the harness 160 in the state that the circuit board 100 is mounted on the image forming apparatus 1. Therefore, in the present embodiment, the wiring work of the harness 160 is performed before the circuit board 100 is mounted.

Figure 14:
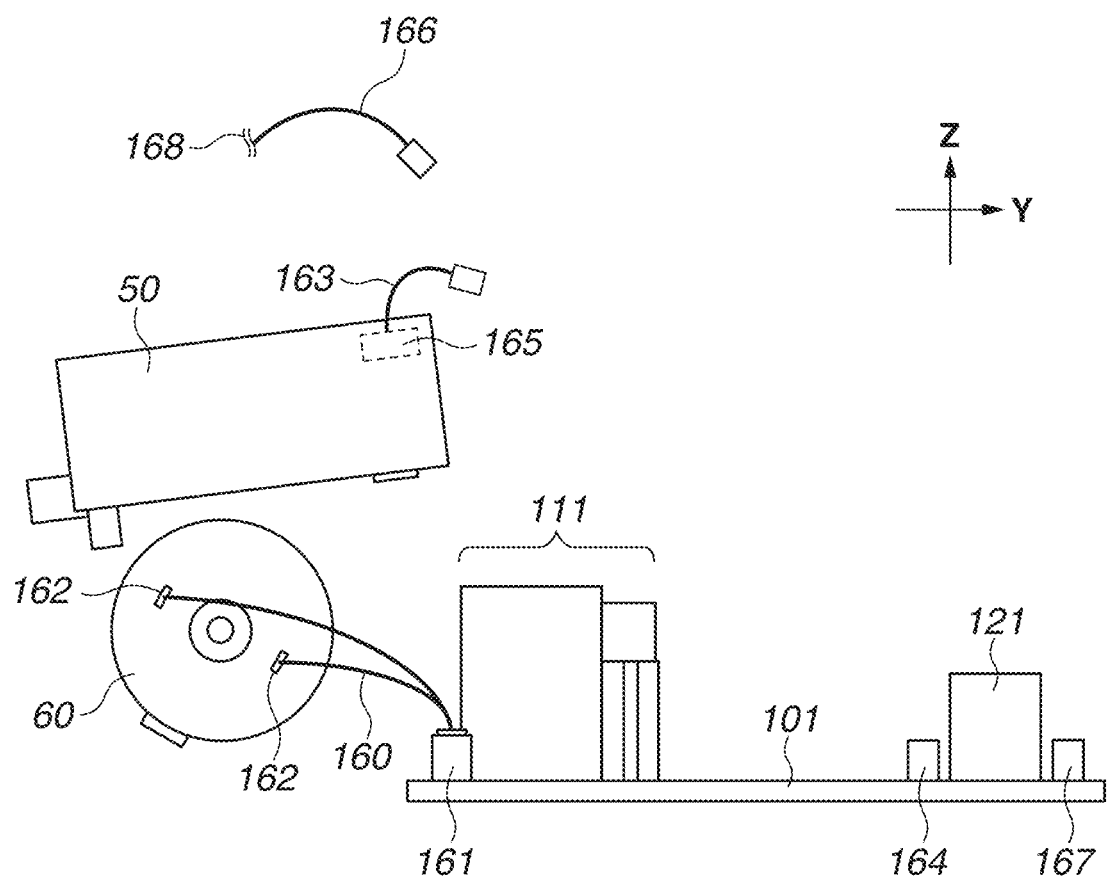
FIG. 14 is a side view illustrating a first stage of a process of mounting the circuit board.
Figure 15:
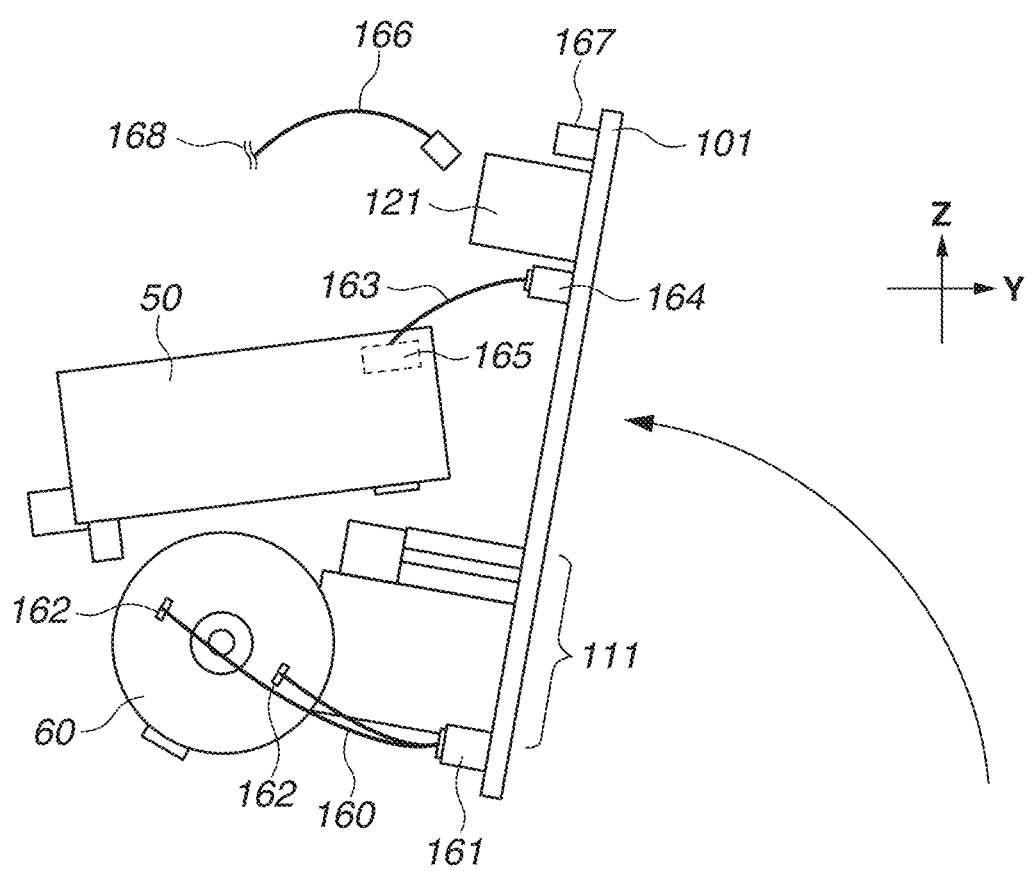
FIG. 15 is a side view illustrating a second stage of the process of mounting the circuit board.
Figure 16:
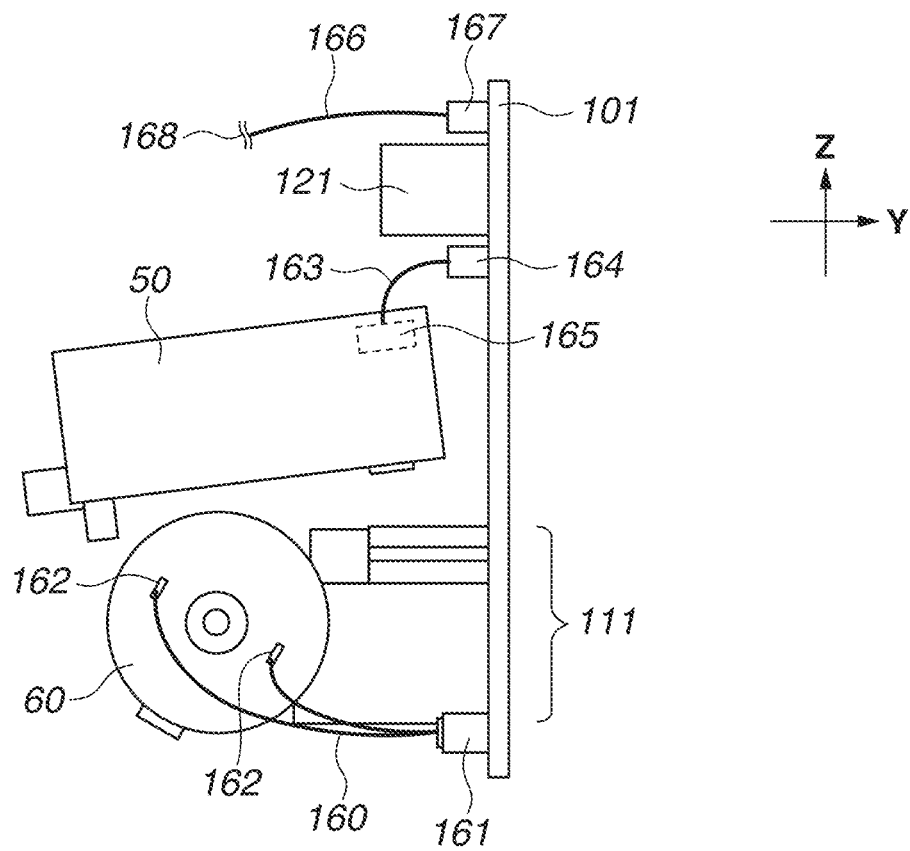
FIG. 16 is a side view illustrating a third stage of the process of mounting the circuit board.

FIGS. 14 to 16 are side views illustrating the procedure of mounting the circuit board 100 onto the image forming apparatus 1 while connecting the harness 160. Since the wiring work cannot be performed in the state that the circuit board 100 is mounted on the image forming apparatus 1 as described above, first, wiring work at the lower stage portion of the image forming apparatus 1 is performed in a state that the circuit board 100 is laid down as illustrated in FIG. 14. In the state that the circuit board 100 is laid down, a work space can be secured on the top surface side of the image forming apparatus 1 (the positive side in the Z direction), and therefore wiring work can be performed to connect the harness 160 to the board-side connector 161 at the lower stage portion.

The electronic component group 111 is disposed on the left side (the negative side in the X direction) of the board-side connector 161 as illustrated in FIG. 13. FIGS. 14 to 16 illustrate the board-side connector 161 as if seeing it through the electronic component group 111 for illustrative purposes.

Next, the circuit board 100 is erected halfway as illustrated in FIG. 15, and wiring work at a middle stage portion is performed to connect a harness 163 to a board-side connector 164. Lastly, wiring work at an upper stage portion is performed in the state that the circuit board 100 is mounted on the image forming apparatus 1 as illustrated in FIG. 16 to connect a harness 166 to a board-side connector 167. The method of mounting the circuit board 100 onto the image forming apparatus 1 while erecting the circuit board 100 allows the wiring work of connecting the harness 160 to the board-side connector 161 to be performed while the length of the harness 160 is reduced.

The mounting method has been described here focusing on the connector 161 and the harness 160 connected to the driving motor 60 as an example, but the procedure of the wiring work is not limited thereto. For example, in a case where the image forming apparatus 1 is configured in such a manner that the board-side connector 164 connected to the connector 165 of the optical box 50 and the board-side connector 167 connected to a connector 168 of a not-illustrated process member are disposed on the lower stage side, the wiring work to connect these connectors may be performed before the wiring work for the driving motor 60.

Positions of Cutout Portions on Circuit Board

Figure 17:
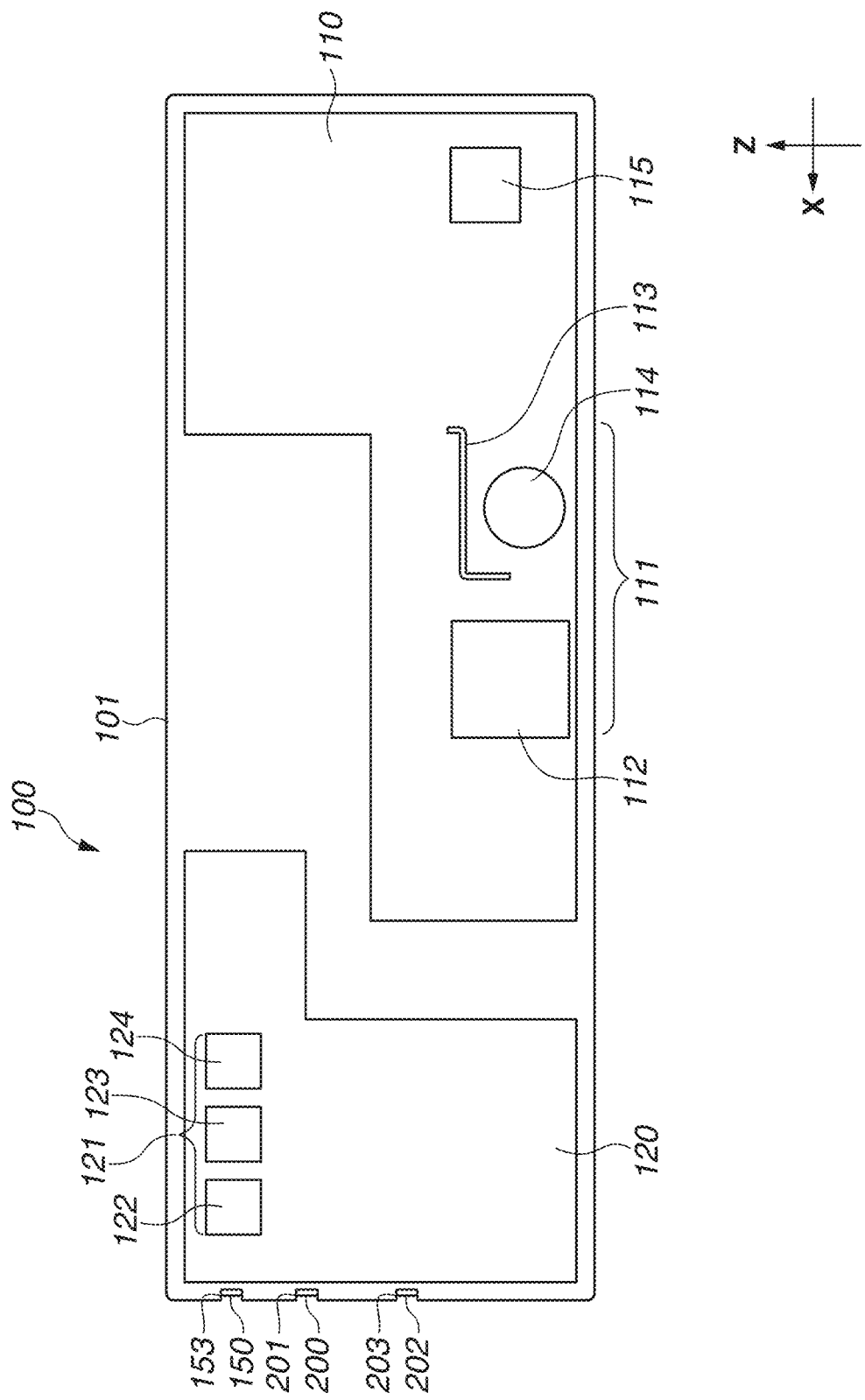
FIG. 17 illustrates the positions of cutout portions for electric contacts on the circuit board.

Next, the positions of the cutout portions on the circuit board 100, which are provided for electric contacts, will be described with reference to FIG. 17. FIG. 17 is a back view of the circuit board 100 when viewed from the back side of the main body.

As illustrated in FIG. 17, the cutout portion 153, which forms a part of the charging contact portion 159 described with reference to FIGS. 11 and 12, is provided at the edge of the circuit board 100 on the positive side in the X direction. Then, the jumper wire 150 is disposed so as to extend across this cutout portion 153. In addition to the cutout portion 153, a jumper wire 200 and a cutout portion 201 for the development, and a jumper wire 202 and a cutout portion 203 for the transfer are provided at the edge of the circuit board 100 on the positive side in the X direction. Hereinafter, when the "cutout portion" is simply used, the term is referred to as including the cutout portions 153, 201, and 203 forming the respective electric contacts for the charging, the development, and the transfer.

In such a configuration, conventionally, the circuit board 100 has been mounted by, for example, a method like inserting it into the image forming apparatus 1 from the negative side in the X direction. In the case where the circuit board 100 is mounted according to the procedure described with reference to FIGS. 14 to 16, the circuit board 100 and the arm portion of the torsion coil spring may interfere with each other when the circuit board 100 is being erected.

This may necessitate a measure such as increasing the size of the cutout portion or shaping the arm portion of the torsion coil spring so as to conform with the trajectory of the circuit board 100 when it is erected.

On the other hand, even if the size of the cutout portion provided to the circuit board 100 is increased so as to prevent the interference between the circuit board 100 and the torsion coil spring, this may bring about such a state that the jumper wire and the arm portion obliquely contact each other, thereby resulting in an unstable connection at the electric contact. Further, when increasing the size of the cutout portion for example, the rigidity of the circuit board 100 may reduce and the mounting space on the circuit board 100 may be limited. Further, the wiring work is performed in parallel when the circuit board 100 is being erected in the configuration according to the present embodiment, and therefore it is undesirable to perform the wiring work in an unstable state that the circuit board 100 is subjected to resilience from the torsion coil spring.

For these reasons, a holding unit for holding the arm portion of the torsion coil spring is provided to the image forming apparatus 1 in the present embodiment.

Configuration of Holding Unit for Holding Arm Portion of Torsion Coil Spring

Figure 18:
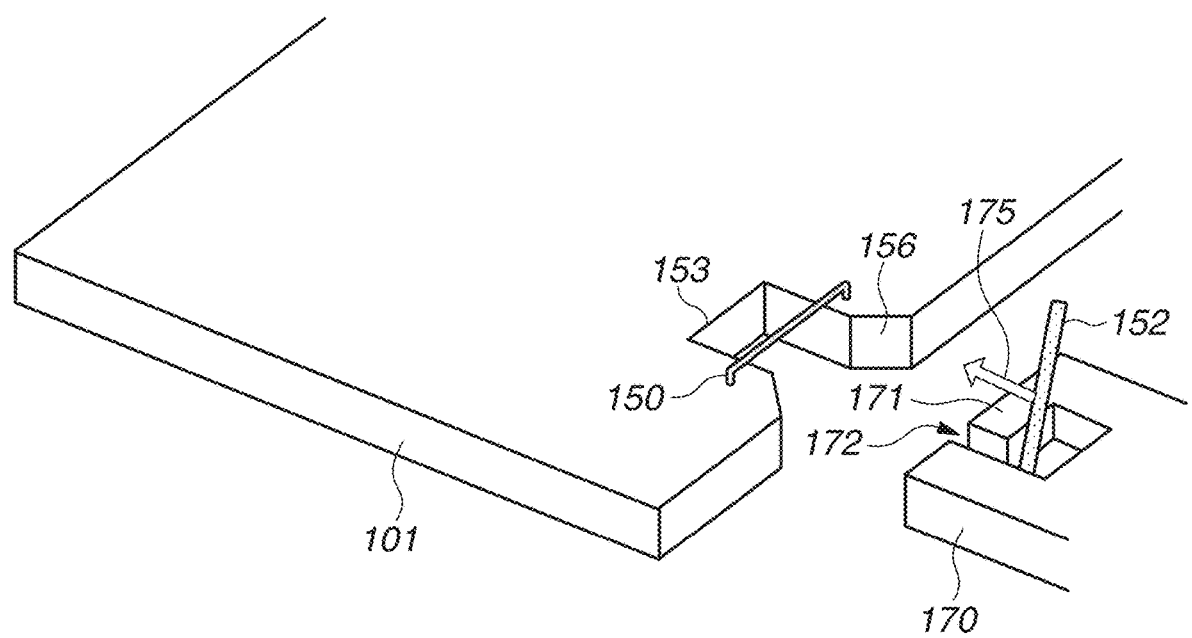
FIG. 18 is a perspective view illustrating the configuration of a holding unit for an arm portion of a torsion coil spring according to a first embodiment.

FIG. 18 is a perspective view illustrating the configuration of the holding unit for the arm portion of the torsion coil spring according to the present embodiment. The configuration of the holding unit at the electric contact for the charging described with reference to FIGS. 11 and 12 will be described here, but the holding units at the electric contacts for the development and transfer are also configured similarly thereto.

FIG. 18 illustrates a holding unit 170 that holds the arm portion 152, which is a part of the charging contact spring 151 (not illustrated in FIG. 18) shaped as a torsion coil spring. The holding unit 170 temporarily holds the arm portion 152 at a position where the arm portion 152 does not come into contact with the jumper wire 150 (hereinafter referred to as a retracted position) so as to prevent the arm portion 152 from entering the trajectory of the circuit board 100 when the circuit board 100 is mounted.

The holding unit 170 is provided to the main body of the image forming apparatus 1, and is fixed to, for example, the right-side plate frame 72 (illustrated in FIG. 8 and the like). The holding unit 170 includes a reception portion 171, which receives a force acting on the arm portion 152 in a direction indicated by an arrow 175, and an L-shaped cutout portion 172 is formed in the holding unit 170. As described above, the arm portion 152 is biased in the direction toward the jumper wire 150 under the influence of the torsion coil spring.

The worker performs the operation of mounting the circuit board 100 onto the image forming apparatus 1 according to the procedure illustrated in FIGS. 14 to 16 in the state that the arm portion 152 is held by the holding unit 170, and detaching the arm portion 152 from the holding unit 170 after that. As a result, the arm portion 152 and the jumper wire 150 can be brought into contact with each other in a stable state as illustrated in FIG. 11.

Further, the cutout portion 153 provided to the printed circuit board 101 has a shape flaring out toward the edge of the printed circuit board 101. This flared portion serves as a guide portion 156, and is configured to guide the arm portion 152 detached from the holding unit 170 to the jumper wire 150.

In this manner, according to the present embodiment, the electric contact can be formed using an elastic member such as a torsion spring coil regardless of the method for mounting the circuit board 100.

Further, the space in the housing 75 of the image forming apparatus 1 can be effectively utilized by mounting the circuit board 100 according to the procedure illustrated in FIGS. 14 to 16. Further, an area for the electric contact of the circuit board 100 can be reduced by forming the electric contact using the torsion coil spring. As a result, the size of the image forming apparatus 1 can be further reduced.

A second embodiment will be described. As described in the first embodiment, the arm portion 152 is held at the retracted position by the holding unit 170 until the circuit board 100 is mounted on the image forming apparatus 1 and the arm portion 152 is connected to the jumper wire 150. In some cases, the arm portion 152 may be accidentally detached from the holding unit 170 due to vibration at the time of the assembling work or if the assembling worker unintentionally touches the arm portion 152.

Figure 19:
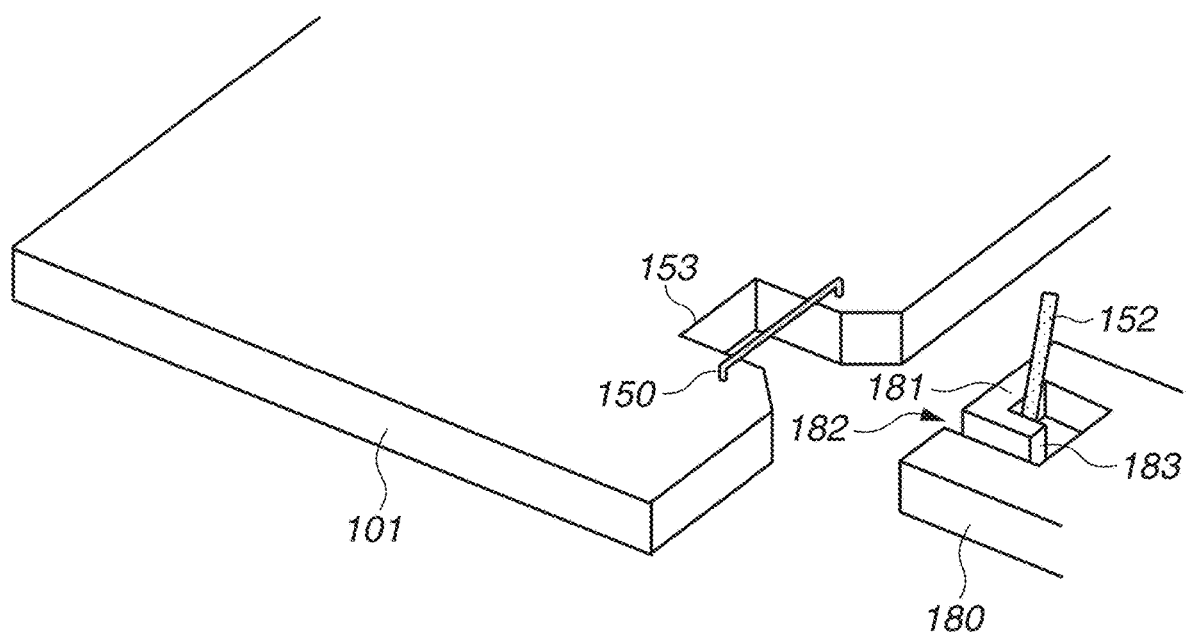
FIG. 19 is a perspective view illustrating the configuration of a holding unit for the arm portion of the torsion coil spring according to a second embodiment.

FIG. 19 is a perspective view illustrating the configuration of a holding unit for holding the arm portion of the torsion coil spring according to the present embodiment. The holding unit according to the present embodiment will be described focusing on differences from the first embodiment, and the description of a similar configuration to the first embodiment will be omitted.

FIG. 19 illustrates a holding unit 180 that holds the arm portion 152, which is a part of the charging contact spring 151 (not illustrated in FIG. 19) shaped as a torsion coil spring. In addition to a reception portion 181 and a cutout portion 182 as in the first embodiment, the holding unit 180 includes a protrusion portion 183 extending from a part of the reception portion 181 in the direction opposite from the jumper wire 150. The protrusion portion 183 prevents the arm portion 152 held by the holding unit 180 from being accidentally detached from the holding unit 180 due to a vibration or the like.

In this manner, according to the present embodiment, the following advantageous effects can be further achieved in addition to the advantageous effects of the first embodiment. That is, the provision of the protrusion portion 183 can prevent the arm portion 152 from being easily detached from the holding unit 180 due to vibration or if the assembling worker unintentionally touches the arm portion 152 when the circuit board 100 is mounted onto the image forming apparatus 1.

The shape of the protrusion portion 183 according to the present embodiment is an example, and is not limited thereto. The protrusion portion 183 may have any shape as long as it can inhibit unintentional detachment of the arm portion 152 from the holding unit 180.

A third embodiment will be described. As described in the first embodiment, the arm portion 152 of the torsion coil spring needs to be moved to the retracted position in advance before the circuit board 100 is mounted onto the image forming apparatus 1. When the mounted circuit board 100 is dismounted, the arm portion 152 needs to be moved from the position where the arm portion 152 is in contact with the jumper wire 150 (a contact position) to the retracted position. At the same time, the size of the holding unit 170 also needs to be reduced as much as possible to reduce the size of the image forming apparatus 1. The reduction in the size of the holding unit 170 naturally leads to a reduction in the size of the cutout portion 172, thereby possibly making it difficult for the worker to perform the work of inserting the arm portion 152 into the holding unit 170.

Figure 20:
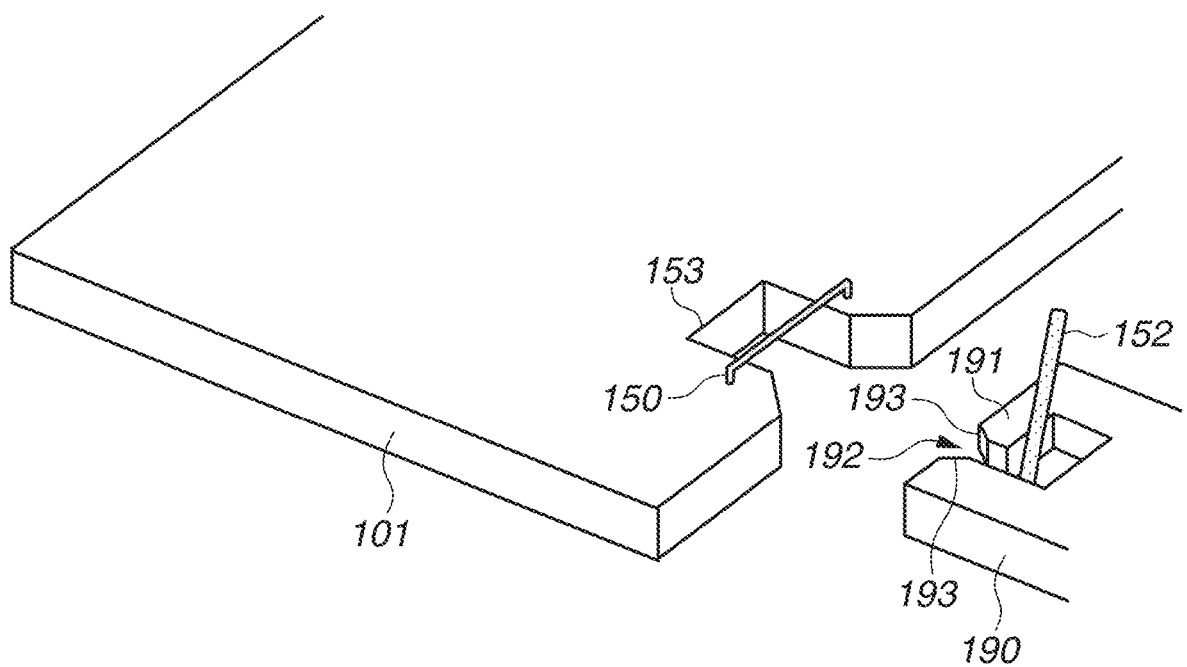
FIG. 20 is a perspective view illustrating the configuration of a holding unit for the arm portion of the torsion coil spring according to a third embodiment.

FIG. 20 is a perspective view illustrating the configuration of a holding unit for holding the arm portion of the torsion coil spring according to the present embodiment. The holding unit according to the present embodiment will be described focusing on differences from the first embodiment, and the description of a similar configuration to the first embodiment will be omitted.

FIG. 20 illustrates a holding unit 190 that holds the arm portion 152, which is a part of the charging contact spring 151 (not illustrated in FIG. 20) shaped as a torsion coil spring. In addition to a reception portion 191 and a cutout portion 192 as in the first embodiment, the holding unit 190 includes a guide portion 193 near the opening of the cutout portion 192. The cutout portion 192 according to the present embodiment has a shape flaring out toward the jumper wire 150, and this flared portion serves as the guide portion 193. The shape of the guide portion 193 facilitates the operation of moving the arm portion 152 from the contact position to the retracted position (facilitates the placing of the arm portion 152 on the holding unit 190), thereby being expected to improve the workability.

In this manner, according to the present embodiment, the following advantageous effects can be further achieved in addition to the advantageous effects of the first embodiment. That is, the provision of the guide portion 193 can improve the workability when the circuit board 100 is dismounted from the image forming apparatus 1.

The shape of the guide portion 193 according to the present embodiment is an example, and is not limited thereto.

The guide portion 193 may have any shape as long as the shape can guide the arm portion 152 into the cutout portion 192 of the holding unit 190.

Exemplary Modifications

The first to third embodiments have been described on the case that all the electric contacts for the charging, the development, and the transfer are similarly configured; however, only one of the electric contacts may be configured according to the above-described first to third embodiments and the others may be configured differently. Further, in the above-described first to third embodiments, the jumper wires and the cutout portions for the respective electric contacts for the charging, the development, and the transfer are provided at the edge of the circuit board 100 on the positive side in the X direction, as described with reference to FIG. 17. However, the jumper wires and the cutout portions are not limited thereto. For example, only the jumper wire and the cutout portion for the charging may be provided at the edge on the positive side in the X direction and the jumper wires and the cutout portions for the development and the transfer may be provided at the edge on the negative side in the X direction.

Further, the above-described first to third embodiments have been described using the charging roller 17, the development roller 12, and the transfer roller 7 as the image forming unit as an example, but the image forming unit is not limited thereto. For example, the configurations according to the embodiments of the present disclosure may be applied to an electric contact for applying a voltage to a member such as the driving motor 60 and the optical box 50. In other words, the configurations according to the embodiments of the present disclosure may be applied to not only the electric contact of the high-voltage power supply unit 120 but also an electric contact of the low-voltage power supply unit 110.

Further, the above-described first to third embodiments have been described using the torsion coil spring as the elastic member, but the elastic member is not limited thereto and may be, for example, a conducting member having an elastic structure such as a plate spring. Then, the conductive member may also be, for example, a metal member shaped like a flat plate without being limited to a liner member like the jumper wire. Further, the shape of the cutout portion is not limited to a square shape and may be, for example, a circular shape, an elliptic shape, or a polygonal shape.

Further, the above-described first to third embodiments have been described using the case where the circuit board 100 is mounted onto the image forming apparatus 1 while erecting the circuit board 100, but the mounting method is not limited thereto. For example, the circuit board 100 may be mounted onto the image forming apparatus 1 in such a manner that the circuit board 100 is inserted into the image forming apparatus 1, or such the circuit board 100 may be mounted onto the image forming apparatus 1 while rotating the circuit board 100 relative to the image forming apparatus 1.

Further, the above-described first to third embodiments have been described based on the configuration in which the low-voltage power supply unit 110 and the high-voltage power supply unit 120 are disposed on the same board (the circuit board 100), but the configuration is not limited thereto. The two power supply units may be disposed on different boards. Then, both the board on which the low-voltage power supply unit 110 is provided and the board on which the high-voltage power supply unit 120 is provided may be disposed on the front surface side of the image forming apparatus 1 illustrated in FIG. 3. Alternatively, only the board on which the low-voltage power supply unit 110 is provided may be disposed on the front surface side, and the board on which the high-voltage power supply unit 120 is provided may be disposed at a different position. Alternatively, only the board on which the high-voltage power supply unit 120 is provided may be disposed on the front surface side, and the board on which the low-voltage power supply unit 110 is provided may be disposed at a different position.

While the present disclosure has been described with reference to embodiments, it is to be understood that the disclosure is not limited to the disclosed embodiments. The scope of the following claims is to be accorded the broadest interpretation so as to encompass all such modifications and equivalent structures and functions.

What is claimed is:

1. An image forming apparatus comprising:
   an image forming unit configured to form an image on a recording material;
   a printed circuit board including a voltage generation unit mounted thereon, the voltage generation unit being configured to generate a voltage to be applied to the image forming unit;
   a conductive member provided on the printed circuit board, the voltage generated by the voltage generation unit being applied to the conductive member;
   an elastic member including an arm portion configured to be biased toward the conductive member and configured to contact with the conductive member, the elastic member being connected to the image forming unit; and
   a holding unit configured to be positioned on a downstream side in an opposite direction opposite to a direction in which the elastic member is biased toward the conductive member with respect to the conductive member,
   wherein the elastic member is capable of being moved to a retracted position in which the elastic member is positioned on the downstream side in the opposite direction with respect to the conductive member and the elastic member is received by the holding unit.

2. The image forming apparatus according to claim 1, wherein the holding unit includes a reception portion configured to receive the elastic member at the retracted position so that the elastic member is held in the retracted position.

3. The image forming apparatus according to claim 2, wherein the holding unit includes a protrusion portion extending from a part of the reception portion in the opposite direction and configured to prevent the arm portion from being detached from the reception portion.

4. The image forming apparatus according to claim 3, wherein the holding unit includes a cutout portion provided along a direction toward the conductive member and having a shape flaring out toward the direction of the conductive member.

5. The image forming apparatus according to claim 2, wherein a cutout portion is provided at an edge of the printed circuit board, and the conductive member is a jumper wire disposed so as to extend across the cutout portion.

6. The image forming apparatus according to claim 5, wherein the cutout portion has a shape flaring out toward the edge of the printed circuit board.

7. The image forming apparatus according to claim 2, wherein the image forming unit is any of a charging unit configured to charge an image bearing member, a development unit configured to form an image on the image bearing member, or a transfer unit configured to transfer the image formed on the image bearing member onto the recording material.

* * * * *